United States Patent
Lai et al.

(10) Patent No.: US 10,276,598 B2
(45) Date of Patent: Apr. 30, 2019

(54) ARRAY SUBSTRATE AND DISPLAY DEVICE

(71) Applicant: BOE TECHNOLOGY GROUP CO., LTD., Beijing (CN)

(72) Inventors: Chengte Lai, Beijing (CN); Hong Wang, Beijing (CN); Chengqi Zhou, Beijing (CN); Shou Li, Beijing (CN); Yaoqiu Jing, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/510,166

(22) PCT Filed: Jul. 29, 2016

(86) PCT No.: PCT/CN2016/092262
§ 371 (c)(1),
(2) Date: Mar. 9, 2017

(87) PCT Pub. No.: WO2017/117987
PCT Pub. Date: Jul. 13, 2017

(65) Prior Publication Data
US 2018/0301467 A1    Oct. 18, 2018

(30) Foreign Application Priority Data
Jan. 7, 2016    (CN) .......................... 2016 1 0008609

(51) Int. Cl.
*H01L 27/12*    (2006.01)
*G09G 3/20*    (2006.01)

(52) U.S. Cl.
CPC ............. *H01L 27/124* (2013.01); *G09G 3/20* (2013.01); *G09G 2300/0439* (2013.01)

(58) Field of Classification Search
CPC .............. H01L 27/124; H01L 27/3246; H01L 27/3265; H01L 27/3262; H01L 27/3276; G09G 3/20
See application file for complete search history.

(56) References Cited

U.S. PATENT DOCUMENTS 6,356,334 B1    3/2002    Mathew et al.
2014/0022148 A1*   1/2014   Kim .................. G09G 5/003
345/55

(Continued)

FOREIGN PATENT DOCUMENTS

CN    105047088 A    11/2015
CN    105137684 A    12/2015

(Continued)

OTHER PUBLICATIONS

International Search Report and Written Opinion for Application No. PCT/CN2016/092262, dated Sep. 30, 2016, 12 Pages.

(Continued)

*Primary Examiner* — Phuc T Dang
(74) *Attorney, Agent, or Firm* — Brooks Kushman P.C.

(57) ABSTRACT

An array substrate and a display device are provided. The array substrate includes a base substrate. The base substrate includes a display area and a non-display area. The display area is provided with a plurality of first signal lines and a plurality of second signal lines. The plurality of first signal lines and the plurality of second signal lines intersect to define a plurality of pixel units, and the plurality of first signal lines is substantially radially distributed.

20 Claims, 10 Drawing Sheets

(56) References Cited

U.S. PATENT DOCUMENTS

| | | |
|---|---|---|
| 2014/0253419 A1 | 9/2014 | Tanada |
| 2015/0129880 A1* | 5/2015 | Wu .................... G09G 3/344 |
| | | 257/72 |
| 2015/0174699 A1* | 6/2015 | Bruck ............... B23K 26/0081 |
| | | 219/121.66 |
| 2017/0069702 A1* | 3/2017 | Jeong .................. H01L 27/3276 |
| 2017/0160596 A1* | 6/2017 | Xiong ............... G02F 1/134309 |
| 2017/0263648 A1 | 9/2017 | Li |

FOREIGN PATENT DOCUMENTS

| | | |
|---|---|---|
| CN | 204883134 U | 12/2015 |
| CN | 105487314 A | 4/2016 |
| CN | 205281093 U | 6/2016 |
| DE | 102014203824 A1 | 9/2014 |
| JP | H02135425 A | 5/1990 |
| JP | 2009145368 A | 7/2009 |
| TW | 201035938 A | 10/2010 |

OTHER PUBLICATIONS

First Office Action for Chinese Application No. 201610008609.2, dated Feb. 14, 2018, 6 Pages.

* cited by examiner

ARRAY SUBSTRATE AND DISPLAY DEVICE

CROSS-REFERENCE TO RELATED APPLICATIONS

This application is the U.S. national phase of PCT Application No. PCT/CN2016/092262 filed on Jul. 29, 2016, which claims priority to Chinese Patent Application No. 201610008609.2 filed on Jan. 7, 2016, the disclosures of which are incorporated in their entirety by reference herein.

TECHNICAL FIELD

The present disclosure relates to the field of display technology, in particular to an array substrate and a display device.

BACKGROUND

With reference to FIG. 1, an array substrate in the related art generally includes a display area 11 and a non-display area 12. The non-display area 12 is arranged at the periphery of the display area 11. The display area 11 is generally in rectangular. Gate lines 111 and data lines 112 which are arranged in horizontal and vertical directions are provided in the rectangular display area 11, and define a plurality of rectangular pixel regions 113. In order to provide signals to gate lines 111 and data lines 112, at least one drive circuit is generally provided in the non-display area 12. As shown in FIG. 1 which takes a drive circuit 20 providing signals to the gate lines 111 as an example, since there are a large number of gate lines 111, a plurality of drive circuits 20 are usually required, which undoubtedly increases the manufacturing costs of the display device.

SUMMARY

(I) Technical Problem to be Solved

In view of this, the present disclosure provides an array substrate and a display device, so as to avoid providing a large number of drive circuits used for supplying signals to signal lines in the display device.

(II) Technical Solutions

To this end, according to a first aspect, the embodiments of the present disclosure provide an array substrate. The array substrate includes a base substrate. The base substrate includes a display area. The display area is provided with a plurality of first signal lines and a plurality of second signal lines. The plurality of first signal lines and the plurality of second signal lines intersect to define a plurality of pixel units, and the plurality of first signal lines is substantially radially distributed.

In a possible embodiment, the plurality of first signal lines includes any of a straight line type, a broken line type or a curve type; or the plurality of first signal lines include any combination of a plurality of above line types.

In a possible embodiment, each of the plurality of second signal lines includes a body part, a shape of the body part matches a shape formed by an outer edge of the display area, and the body parts of the plurality of second signal lines are successively distributed outwards by taking a radiation center of the plurality of first signal lines radially distributed as a center.

In a possible embodiment, the shape formed by the outer edge of the display area is a regular shape, the radiation center is a center of the regular shape, and the shapes formed by the body parts of the plurality of second signal lines are similar shapes being concentric and having different areas.

In a possible embodiment, the plurality of pixel units have a substantially identical area.

In a possible embodiment, the pixel units are triangular, rectangular, trapezoidal or sector-ringed.

In a possible embodiment, the regular shape is a circle, the body part of each of the plurality of second signal lines is a circle or arc, the body parts of the plurality of second signal lines are concentric circles having different radii or concentric arcs having different curvature radii, and the radiation center is the center of the circle.

In a possible embodiment, differences between the radii of every two adjacent concentric circles or differences between the curvature radii of every two adjacent concentric arcs are different.

In a possible embodiment, the differences between the radii or the differences between the curvature radii gradually decrease in a direction extending from the center of the circle to the outer edge of the display area.

In a possible embodiment, a distribution density of the body parts of the plurality of second signal lines gradually decreases in a direction extending from a center of the shape formed by the outer edge to the outer edge.

In a possible embodiment, widths of the body parts of the plurality of second signal lines gradually increase in a direction extending from a center of the shape formed by the outer edge to the outer edge.

In a possible embodiment, proportions of the radii or curvature radii of the body parts of the plurality of second signal lines successively distributed in a direction extending from the center of the circle to the outer edge satisfy a following condition: $\sqrt{1}:\sqrt{2}:\sqrt{3}:2\ldots\sqrt{n}$, where n is a number of the plurality of second signal lines.

In a possible embodiment, one of the first signal line and the second signal line is a gate line, and a remaining one of the first signal line and the second signal line is a data line.

According to a second aspect, the embodiments of the present disclosure provide a display device including the above-mentioned array substrate.

In a possible embodiment, the display device further includes a non-display area and a drive circuit. The drive circuit is arranged in the non-display area and in a region of the non-display area surrounded by the display area, and a radiation center of the plurality of first signal lines is located in the region of the non-display area surrounded by the display area.

In a possible embodiment, the drive circuit includes a first signal line drive circuit and/or a second signal line drive circuit.

In a possible embodiment, each of the plurality of second signal lines further includes a lead part, and a body part of each of the plurality of second signal lines is connected with the second signal line drive circuit through the lead part corresponding to the body part.

(III) Beneficial Effects

At least one embodiment of the present disclosure has at least the following beneficial effects: since the plurality of first signal lines is substantially radially distributed, the area in which the radiation center of the substantially radially distributed first signal lines is located may be used as the non-display area. The non-display area is provided with at least a drive circuit connected with the first signal lines. Since the plurality of first signal lines are in a converged form in the area in which the radiation center is located, only a small number of drive circuits or even a single drive circuit is required to accomplish the connection with the first signal lines, thereby effectively decreasing the number of the drive circuits and reducing the costs of the display device.

BRIEF DESCRIPTION OF THE DRAWINGS

In order to more clearly illustrate the embodiments of the present disclosure or the technical solutions in the related art, drawings which are required to be used in the description of the embodiments will be briefly described below. Apparently, the drawings in the following description relate to only some embodiments of the present disclosure. It will be apparent to a person of ordinary skills in the art that other drawings may be derived from the drawings without any creative work.

DETAILED DESCRIPTION

The present disclosure will be specifically described in conjunction with accompanying drawings and embodiments. The following embodiments are merely illustrative of the present disclosure and are not intended to limit the scope of the present disclosure.

In order to make the objectives, technical solutions and advantages of the embodiments of the present disclosure more clear, the technical solutions of the embodiments of the present disclosure will be clearly and completely described below with reference to the accompanying drawings of the embodiments of the present disclosure. Apparently, the described embodiments are part of the embodiments of the present disclosure, but not all the embodiments. All other embodiments obtained by a person of ordinary skills in the art based on the described embodiments of the present disclosure are intended to be within the scope of the present disclosure.

Unless otherwise defined, technical or scientific terms used herein shall have the ordinary meanings as understood by a person of ordinary skills in the art to which the present disclosure pertains. The words "first," "second," and the like as used in the specification and claims of the present disclosure do not denote any order, amount or importance, but are merely used to distinguish different constituent parts. Similarly, the words "a" or "an" and the like are merely used to represent the existence of at least one member, rather than to limit the number thereof. The words "connect" or "connected" and the like are not limited to physical or mechanical connections, but may include electrical connections, whether direct or indirect. The words "on", "under", "left" and "right" and the like are merely used to indicate relative position relationships, and when an absolute position of the described object changes, the relative position relationships changes accordingly.

The present disclosure will be specifically described in conjunction with accompanying drawings and embodiments. The following embodiments are merely illustrative of the present disclosure and are not intended to limit the scope of the present disclosure.

The present disclosure provides an array substrate which includes a base substrate. The base substrate includes a display area. A plurality of first signal lines and a plurality of second signal lines are provided in the display area, and the plurality of first signal lines and the plurality of second signal lines intersect to define a plurality of pixel units. The plurality of first signal lines are distributed in a substantially radial shape.

The above-mentioned "substantially radial shape" refers to a shape formed by radiating outwards from a radiation center. The radiation center may be, for example, a point or an area.

The first signal lines may be gate lines and the second signal lines may be data lines. Optionally, the first signal lines may be data lines and the second signal lines may be gate lines.

Figure 1:
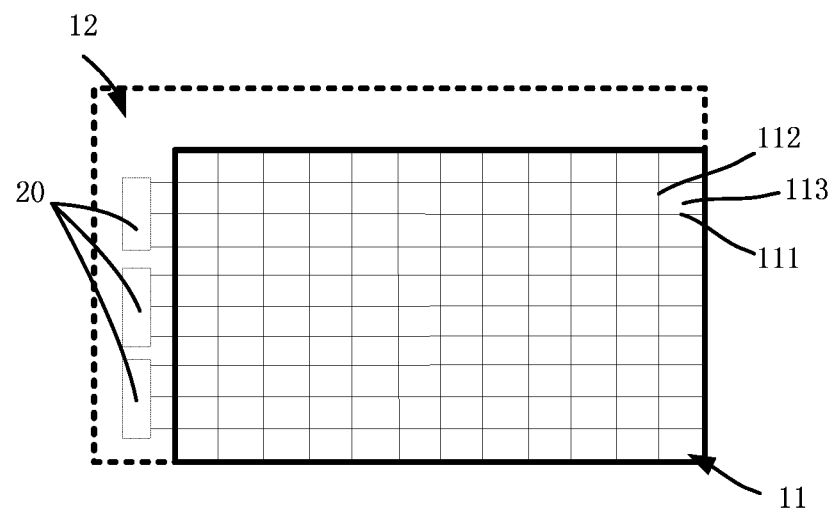
FIG. 1 is a schematic diagram of an existing array substrate.
Figure 2:
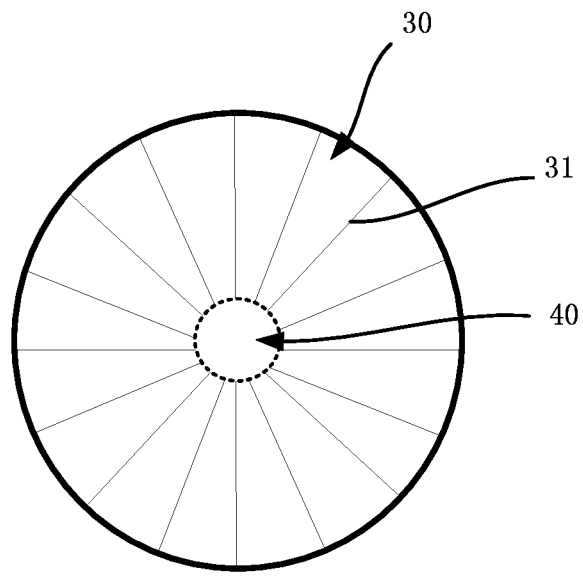
FIG. 2 is a schematic diagram of an array substrate according to at least one embodiment of the present disclosure.

Referring to FIG. 2, a schematic diagram of an array substrate provided by a first embodiment of the present disclosure is shown. In the embodiment as shown in FIG. 2, the shape surrounded by the outer edge of the display area 30 of the array substrate is circular, and the display area 30 as a whole is circular. The plurality of first signal lines 31 are straight and substantially radially distributed with the center of the circle formed by the outer edge used as the radiation center. Furthermore, the above-mentioned radiation center is located in the non-display area 40 (the area surrounded by the dotted line) of the array substrate. The display area 30 is arranged at the periphery of the non-display area 40, and the drive circuit(s) used to be connected with the first signal lines 31 may be arranged in the non-display area 40. The drive circuit(s) for the first signal lines of the display panel formed in this way may be arranged in the middle area of the display panel, and thus the drive circuit(s) may not be arranged at the periphery of the display area of the display panel, which makes it possible to reduce the bezel size of the display device including the display panel, especially for the abnormally shaped display panel in which the number of drive circuits required and the area occupied are much larger than those of a conventional display due to the abnormal shape of the display panel.

Figure 3:
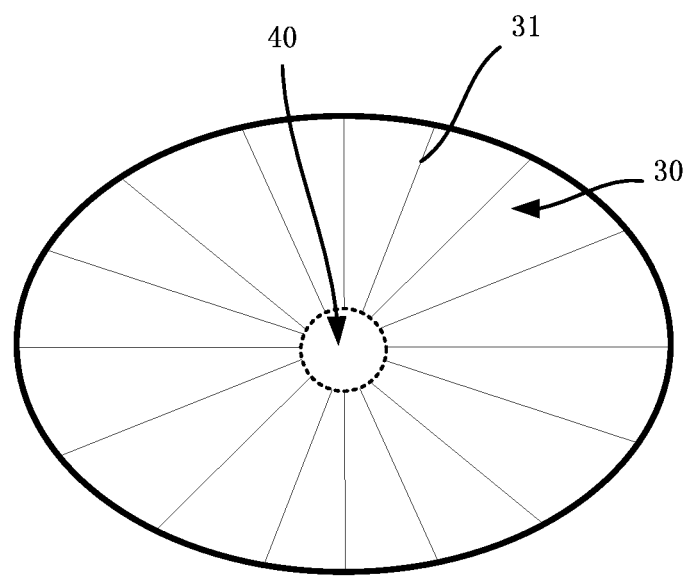
FIG. 3 is a schematic diagram of an array substrate according to at least one embodiment of the present disclosure.

Referring to FIG. 3, a schematic diagram of an array substrate provided by a second embodiment of the present disclosure is shown. In the embodiment as shown in FIG. 3, the shape surrounded by the outer edge of the display area 30 of the array substrate is oval. The plurality of first signal lines 31 are straight and substantially radially distributed with the center of the ellipse formed by the outer edge used as the radiation center. Furthermore, the above-mentioned radiation center is located in the non-display area 40 (the area surrounded by the dotted line) of the array substrate. That is, the display area 30 is arranged at the periphery of the non-display area 40, and the drive circuit(s) used to be connected with the first signal lines 31 may be arranged in the non-display area 40.

Figure 4:
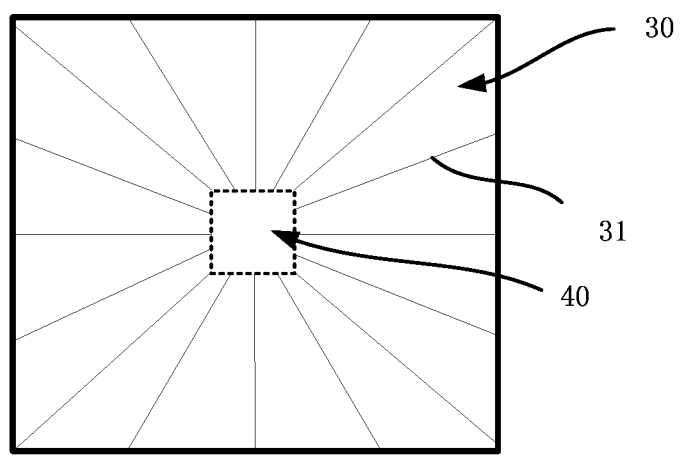
FIG. 4 is a schematic diagram of an array substrate according to at least one embodiment of the present disclosure.

Referring to FIG. 4, a schematic diagram of an array substrate provided by a third embodiment of the present disclosure is shown. In the embodiment as shown in FIG. 4, the shape surrounded by the outer edge of the display area 40 of the array substrate is square. The plurality of first signal lines 31 are straight and substantially radially distributed with the center of the square formed by the outer edge used as the radiation center. Furthermore, the above-mentioned radiation center is located in the non-display area 40 (the area surrounded by the dotted line) of the array substrate. That is, the display area 30 is arranged at the periphery of the non-display area 40, and the drive circuit(s) used to be connected with the first signal lines 31 may be arranged in the non-display area 40.

In the embodiments as shown in FIGS. 2-4, the first signal lines are straight and substantially radially distributed with the center of the shape formed by the outer edge of the display area of the array substrate used as the radiation center. In other embodiments of the present disclosure, the first signal lines may also be broken lines or curves, or a combination of straight lines, broken lines, or curves.

Figure 5:
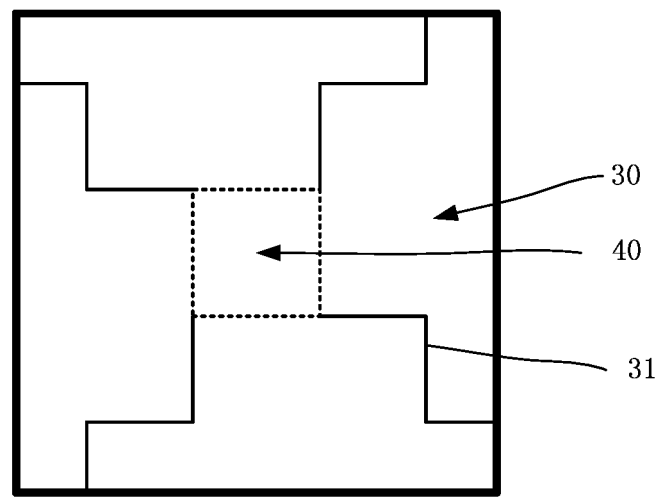
FIG. 5 is a schematic diagram of an array substrate according to at least one embodiment of the present disclosure.
Figure 6:
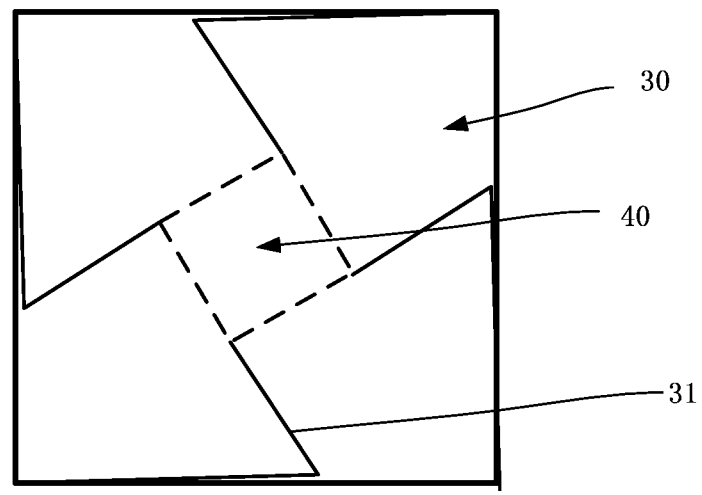
FIG. 6 is a schematic diagram of an array substrate according to at least one embodiment of the present disclosure.

Hereinafter, referring to FIGS. 5 and 6, FIG. 5 is a schematic diagram of an array substrate provided by a fourth embodiment of the present disclosure, and FIG. 6 is a schematic diagram of an array substrate provided by a fifth embodiment of the present disclosure. In the embodiments as shown in FIGS. 5 and 6, the first signal lines 31 are all broken lines, and radiated outwards from the center of the shape (squares as shown in FIGS. 5 and 6) formed by the outer edges of the display area 30 of the array substrate which is used as the radiation center. Furthermore, the above-mentioned radiation center is located in the non-display area 40 (the area surrounded by the dotted line) of the array substrate. That is, the display area 30 is arranged at the periphery of the non-display area 40, and the drive circuit(s) used to be connected with the first signal lines 31 may be arranged in the non-display area 40.

Figure 7:
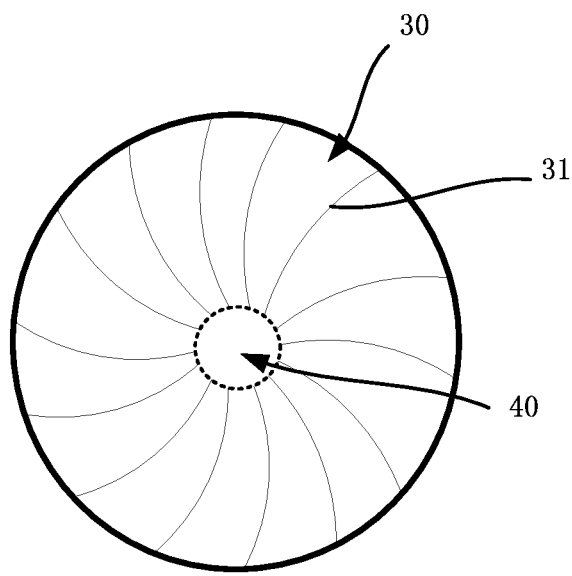
FIG. 7 is a schematic diagram of an array substrate according to at least one embodiment of the present disclosure.

Referring to FIG. 7, a schematic diagram of an array substrate provided by a sixth embodiment of the present disclosure is shown. In the embodiment as shown in FIG. 7, the shape formed by the outer edge of the display area 30 of the array substrate is circular. The plurality of first signal lines 31 are all curves 31 and substantially radially distributed with the center of the circle formed by the outer edge used as the radiation center. Furthermore, the above-mentioned radiation center is located in the non-display area 40 (the area surrounded by the dotted line) of the array substrate. That is, the display area 30 is arranged at the periphery of the non-display area 40, and the drive circuit(s) used to be connected with the first signal lines 31 may be arranged in the non-display area 40.

In the above-mentioned embodiments, optionally, the plurality of first signal lines 31 are distributed uniformly.

In the embodiments of the present disclosure, the shape formed by the outer edge of the display area is regular (e.g. circular, oval, square or rectangular). Apparently, the shape formed by the outer edge of the display area may be irregular.

In the above-mentioned embodiments, the shape formed by the outer edge of the display area may be circular, oval, square or rectangular, etc. However, in some other embodiments of the present disclosure, the shape formed by the outer edge of the display area may also be approximately circular, oval, square or rectangular, etc. For example, the outer edge is not a smooth curve or straight line, but a jagged curve or straight line.

In the above-mentioned embodiments, since the plurality of first signal lines on the array substrate are substantially radially distributed and the radiation center of the plurality of first signal lines substantially radially distributed is located in the non-display area of the array substrate, the drive circuit(s) connected with the first signal lines may be arranged in the non-display area. Since the plurality of first signal lines are in a converged form in the non-display area where the radiation center is located, only a small number of drive circuits or even a single drive circuit is required to accomplish the connection with the first signal lines, thereby effectively decreasing the number of the drive circuits and reducing the costs of the display device. Meanwhile, the area of the peripheral area may be reduced so that the bezel of the display device becomes narrower.

Apparently, in some other embodiments of the present disclosure, regardless of the number of drive circuits connected with the first signal lines, the possibility that the non-display area is positioned outside the display area is not excluded, but this increases the width of the bezel.

The shape of the first signal lines is described in the above-mentioned embodiments, and the shape of the second signal lines will be described hereinafter.

In an embodiment of the present disclosure, optionally, each of the second signal line includes a body part, the shape of which matches the shape formed by the outer edge of the display area. The above-mentioned "matches" means that the shapes are similar or approximately similar. Furthermore, each of the second signal lines further includes a lead part through which the body part of the second signal line is connected with the drive circuit. It should be noted that the body part of the second signal line may be directly connected with the above-mentioned drive circuit. The shapes which are similar or approximately similar will be described in the following embodiments.

Figure 8:
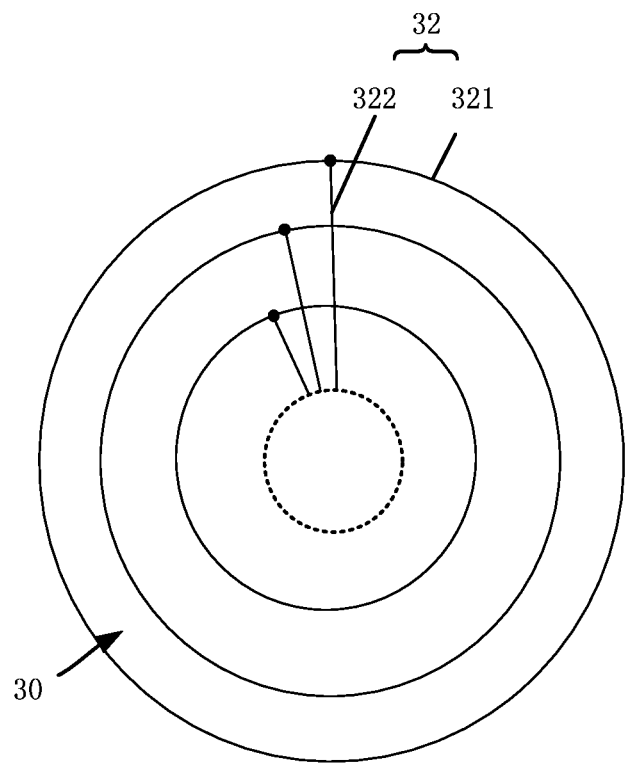
FIG. 8 is a schematic diagram of an array substrate according to at least one embodiment of the present disclosure.

Referring to FIG. 8, a schematic diagram of an array substrate provided by a seventh embodiment of the present disclosure is shown. In the embodiment as shown in FIG. 8, the shape formed by the outer edge of the display area 30 is circular and the second signal lines 32 include body parts 321 and lead parts 322. The body parts 321 are circles similar to the shape formed by the outer edge of the display area 30, and the second parts 322 are straight lines.

Figure 9:
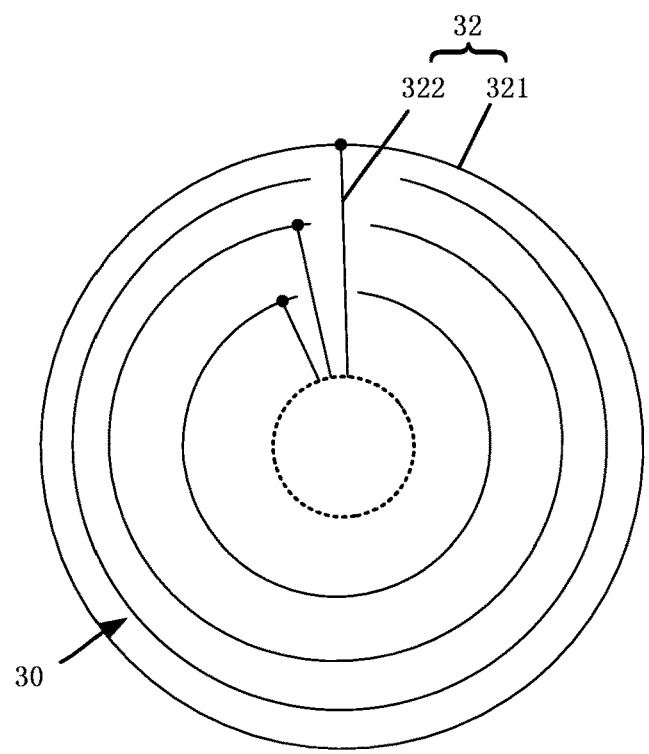
FIG. 9 is a schematic diagram of an array substrate according to at least one embodiment of the present disclosure.

Referring to FIG. 9, a schematic diagram of an array substrate provided by an eighth embodiment of the present disclosure is shown. In the embodiment as shown in FIG. 9, the shape formed by the outer edge of the display area 30 is circular and the second signal lines 32 include body parts 321 and lead parts 322. The body parts 321 are arcs similar to the shape formed by the outer edge of the display area 30, and the lead parts 322 are straight lines.

Figure 10:
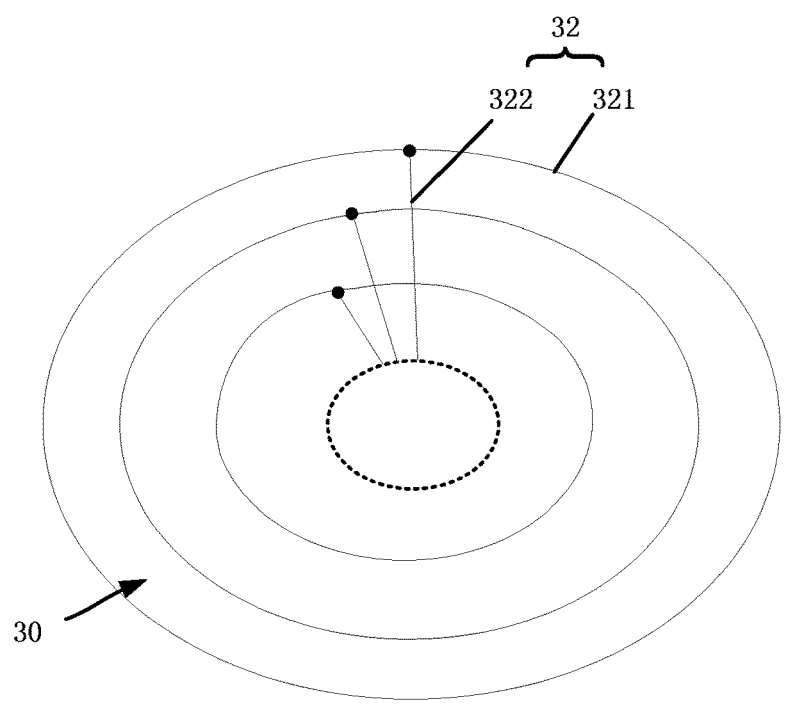
FIG. 10 is a schematic diagram of an array substrate according to at least one embodiment of the present disclosure.

Referring to FIG. 10, a schematic diagram of an array substrate provided by a ninth embodiment of the present disclosure is shown. In the embodiment as shown in FIG. 10, the shape formed by the outer edge of the display area 30 is oval and the second signal lines 32 include body parts 321 and lead parts 322. The body parts 321 are ellipses similar to the shape formed by the outer edge of the display area 30, and the second parts 322 are straight lines.

Figure 11:
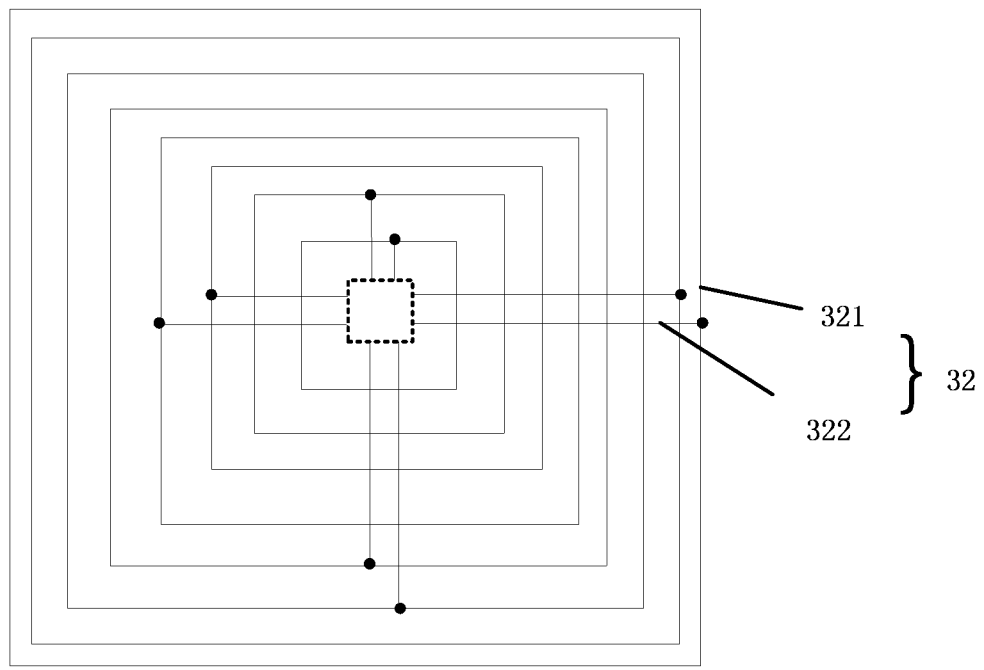
FIG. 11 is a schematic diagram of an array substrate according to at least one embodiment of the present disclosure.

Referring to FIG. 11, a schematic diagram of an array substrate provided by a tenth embodiment of the present disclosure is shown. In the embodiment as shown in FIG. 11, the shape formed by the outer edge of the display area 30 is square and the second signal lines 32 include body parts 321 and lead parts 322. The body parts 321 are squares similar to the shape formed by the outer edge of the display area 30, and the second parts 322 are straight lines.

Figure 12:
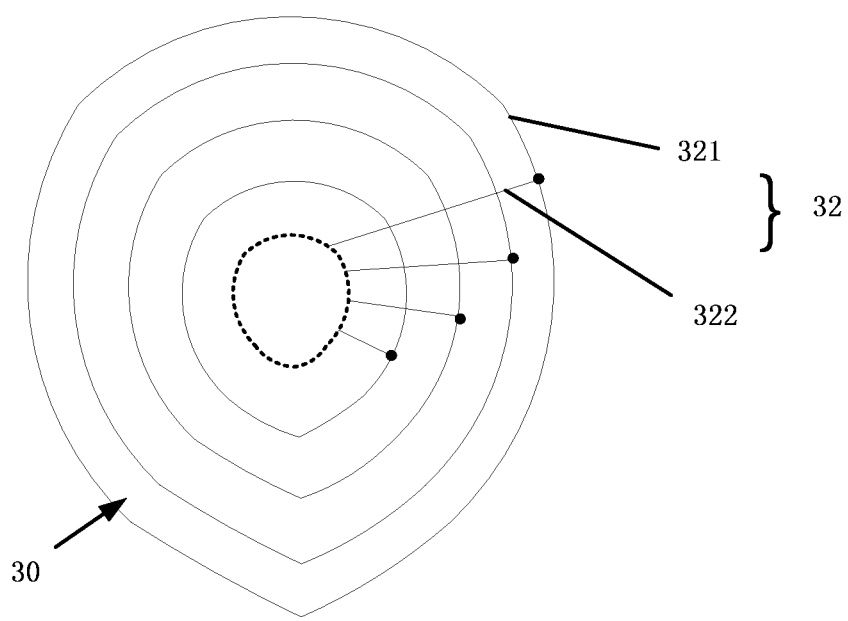
FIG. 12 is a schematic diagram of an array substrate according to at least one embodiment of the present disclosure.

In the embodiments as shown in FIGS. 8-11, the shape formed by the outer edge of the display area of the above-mentioned array substrate are regular, and the above-mentioned radiation center is the center of the regular shapes. However, in some other embodiments of the present disclosure, the shape formed by the out edge of the display area may also be irregular, and the shapes formed by the body parts 321 of the plurality of second signal lines are similar concentric shapes having different areas. The shape formed by the outer edge of the array substrate may be irregular. Particularly referring to FIG. 12, a schematic diagram of an array substrate provided by an eleventh embodiment of the present disclosure is shown.

In the above-mentioned embodiments, the second signal lines include body parts which match the shape formed by the outer edge of the display area, so that the layout of the signal lines is more suitable for the shape of the display area of the current array substrate. Particularly, this layout structure has more significant advantages in abnormally shaped displays.

In the above-mentioned embodiments, if the shape surrounded by the outer edge of the display area is regular, the body parts of the plurality of second signal lines on the above-mentioned array substrate may be distributed at equal intervals. Optionally, the spacing between the body parts of two adjacent second signal lines gradually decreases in the direction extending from the center of the outer edge of the above-mentioned display area to the outer edge.

In the above-mentioned embodiments, if the shape surrounded by the outer edge of the display area is irregular, the distribution density of the body parts of the plurality of second signal lines on the above-mentioned array substrate gradually decreases in the direction extending from the center of the out edge of the above-mentioned display area to the out edge.

The body and lead parts of the above-mentioned second signal line may be made of the same material and arranged on the same layer through one patterning process.

The body and lead parts of the above-mentioned second signal line may be arranged on different layers and connected through via hole(s).

In an optional embodiment of the present disclosure, each of the above-mentioned second signal lines include a body part, the shape of the body part matches the shape formed by the outer edge of the display area, and the body parts of the above-mentioned plurality of second signal lines are centered on the radiation center of the plurality of first signal lines substantially radially distributed and successively distributed outwards. Particularly referring to FIG. 15, the radiation center of the plurality of first signal line 31 is the center of the square, and the body parts 321 of the plurality of second signal lines are centered on the radiation center and successively distributed outwards with the radiation center serving.

In an optional embodiment of the present disclosure, the shape formed by the outer edge of the above-mentioned display area is regular and the above-mentioned plurality of first signal lines are substantially radially distributed with the central area of the shape formed by the out edge of the above-mentioned display area used as the radiation center. The radiation center is the center of the regular shape and the body parts of the above-mentioned plurality of second signal lines are similar concentric shapes having different areas. Particularly referring to FIG. 15, a plurality of body parts 321 are similar concentric squares having different areas.

Further optionally, all the pixel units on the array substrate have the same area. Optionally, all the pixel units have a shape of the same type. The shapes of the above-mentioned pixel units may be triangular, rectangular, trapezoidal or sector-ringed, etc.

The following descriptions are given by way of examples.

Figure 13:
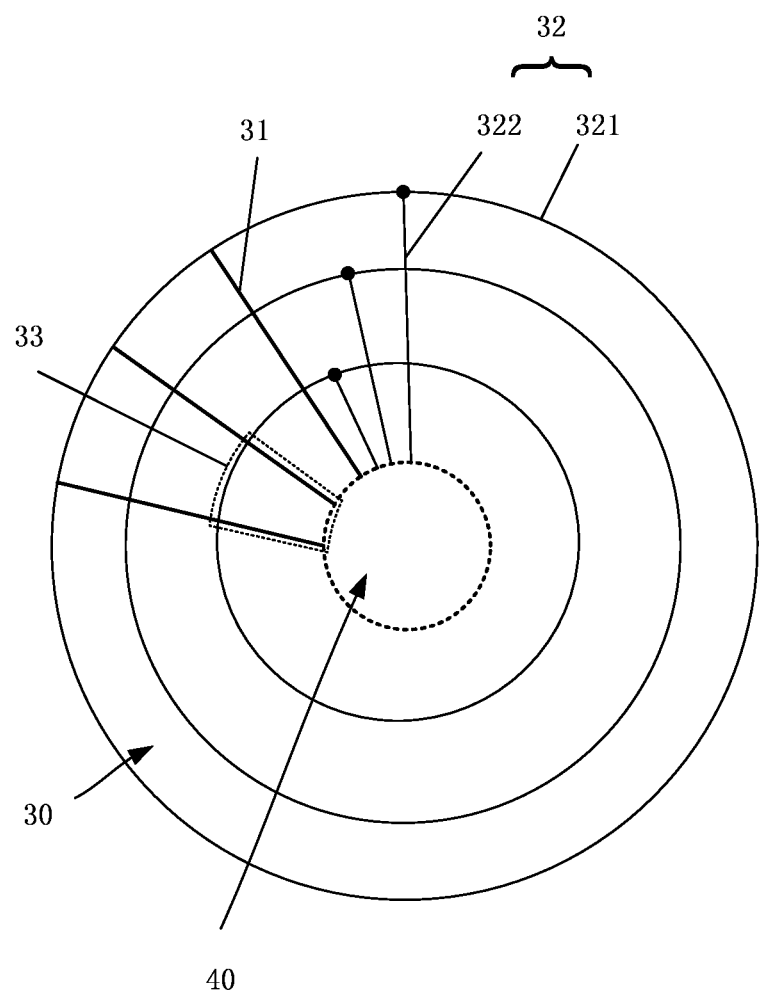
FIG. 13 is a schematic diagram of an array substrate according to at least one embodiment of the present disclosure.

Referring to FIG. 13, a schematic diagram of an array substrate provided by a twelfth embodiment of the present disclosure is shown. In the embodiment as shown in FIG. 13, the shape formed by the outer edge of the display area 30 of the array substrate is circular, and the plurality of first signal lines 31 on the array substrate are straight lines substantially radially distributed with the center of the shape formed by the outer edge (i.e. the center of the circle) used as the radiation center. A plurality of second signal lines 32 are also provided on the array substrate, each of the second signal lines 32 includes a body part 321 and a lead part 322. The body part 321 forms a circle matching the shape formed by the outer edge of the display area 30, and the body parts of the plurality of second signal lines form concentric circles having different radii and centered on the center of the circle. The above-mentioned first signal lines 31 and second signal lines 32 intersect to define a plurality of pixel units 33. In the present embodiment, the pixel unit 33 has a shape of a sector-ring.

The areas 40 circled by dotted lines in FIGS. 13-18 represent the non-display area of the array substrate.

Figure 14:
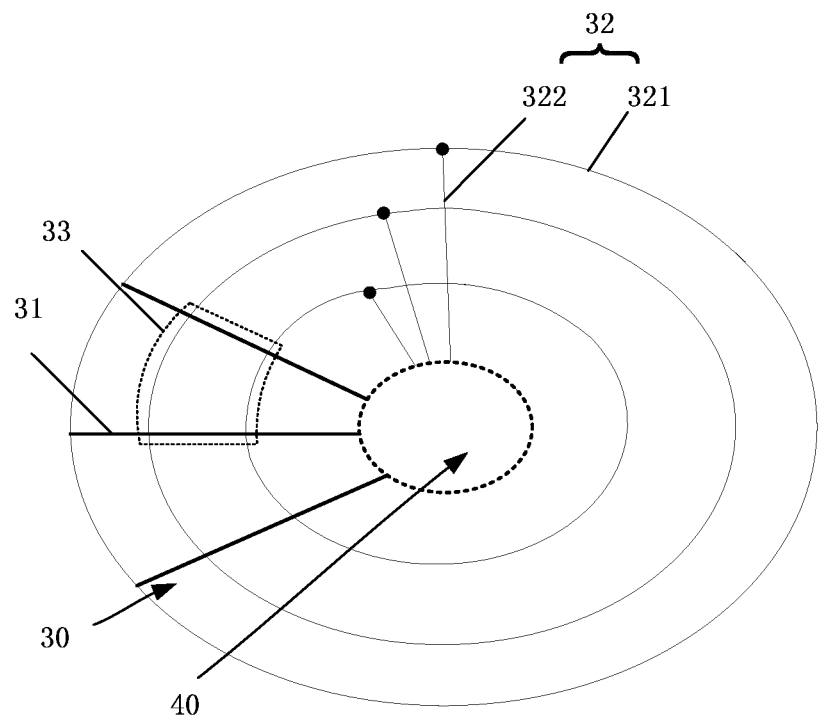
FIG. 14 is a schematic diagram of an array substrate according to at least one embodiment of the present disclosure.

Referring to FIG. 14, a schematic diagram of an array substrate provided by a thirteenth embodiment of the present disclosure is shown. In the embodiment as shown in FIG. 14, the shape formed by the outer edge of the display area 30 of the array substrate is oval, and the plurality of first signal lines 31 on the array substrate are straight lines substantially radially distributed with the center of the shape formed by the outer edge used as the radiation center. A plurality of second signal lines 32 are also provided on the array substrate, each of the second signal lines 32 includes a body part 321 and a lead part 322. The body part 321 forms an ellipse matching the shape formed by the outer edge, and the body parts of the plurality of second signal lines form concentric circles centered on the above-mentioned radiation center and having different distances from the above-mentioned radiation center. The above-mentioned first signal lines 31 and second signal lines 32 intersect to define a plurality of pixel units 33. In the present embodiment, the pixel unit 33 has a shape of a sector-ring.

Figure 15:
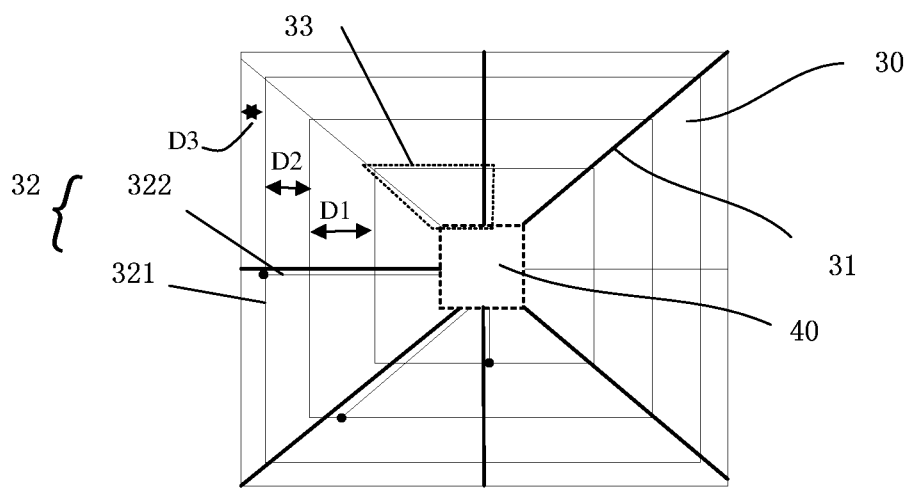
FIG. 15 is a schematic diagram of an array substrate according to at least one embodiment of the present disclosure.

Referring to FIG. 15, a schematic diagram of an array substrate provided by a fourteenth embodiment of the present disclosure is shown. In the embodiment as shown in FIG. 15, the shape formed by the outer edge of the display area 30 of the array substrate is rectangular, and the plurality of first signal lines 31 on the array substrate are straight lines substantially radially distributed with the center of the shape formed by the outer edge (i.e. the center of the above-mentioned rectangle) used as the radiation center. A plurality of second signal lines 32 are also provided on the array substrate, each of the second signal lines 32 includes a body part 321 and a lead part 322. The body part 321 forms a rectangle matching the shape formed by the outer edge, and the body parts of the plurality of second signal lines form concentric rectangles centered on the above-mentioned radiation center and having different distances from the above-mentioned radiation center. The above-mentioned first signal lines 31 and second signal lines 32 intersect to define a plurality of pixel units 33. In the present embodiment, the pixel unit 33 has a shape of a trapezoid.

Figure 16:
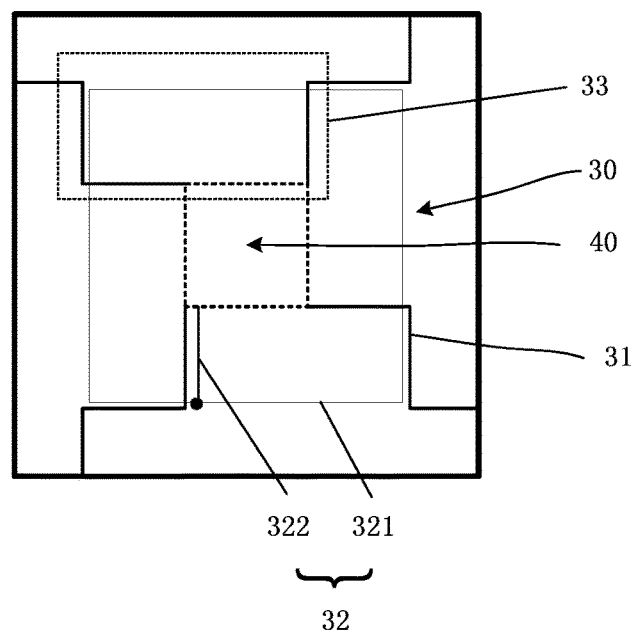
FIG. 16 is a schematic diagram of an array substrate according to at least one embodiment of the present disclosure.

Referring to FIG. 16, a schematic diagram of an array substrate provided by a fifteenth embodiment of the present disclosure is shown. In the embodiment as shown in FIG. 16, the shape formed by the outer edge of the display area 30 of the array substrate is rectangular, and the plurality of first signal lines 31 on the array substrate are broken lines substantially radially distributed with the center of the shape surrounded by the outer edge used as the radiation center. A plurality of second signal lines 32 are also provided on the array substrate, each of the second signal lines 32 includes a body part 321 and a lead part 322. The body part 321 forms a rectangle matching the shape formed by the outer edge, and the body parts of the plurality of second signal lines form concentric rectangles centered on the above-mentioned radiation center and having different distances from the above-mentioned radiation center. The above-mentioned first signal lines 31 and second signal lines 32 intersect to define a plurality of pixel units 33. In the present embodiment, the pixel unit 33 has a shape of a rectangle.

Figure 17:
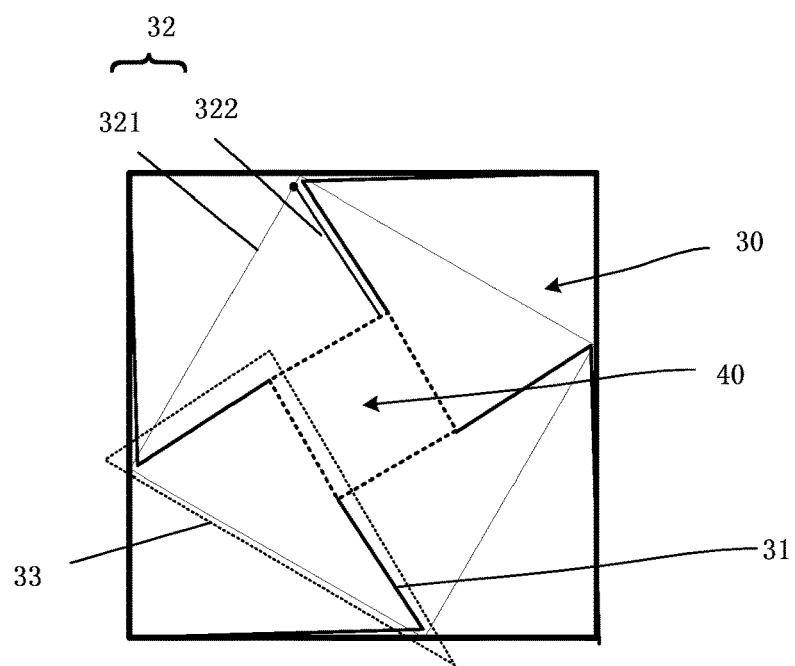
FIG. 17 is a schematic diagram of an array substrate according to at least one embodiment of the present disclosure.

Referring to FIG. 17, a schematic diagram of an array substrate provided by a sixteenth embodiment of the present disclosure is shown. In the embodiment as shown in FIG. 17, the shape formed by the outer edge of the display area 30 of the array substrate is rectangular, and the plurality of first signal lines 31 on the array substrate are broken lines substantially radially distributed with the center of the shape formed by the outer edge used as the radiation center. A plurality of second signal lines 32 are also provided on the array substrate, each of the second signal lines 32 includes a body part 321 and a lead part 322. The body part 321 forms a rectangle matching the shape formed by the outer edge, and the body parts of the plurality of second signal lines form concentric rectangles centered on the above-mentioned radiation center and having different distances from the above-mentioned radiation center. The above-mentioned first signal lines 31 and second signal lines 32 intersect to define a plurality of pixel units 33. In the present embodiment, the pixel unit 33 has a shape of a triangle.

In the embodiments as shown in FIGS. 13-17, optionally, all the pixel units on the array substrate have the same area. The same area of the pixel units can improve the display effect so as to display images in a better way.

In the embodiments as shown in FIGS. 13 and 14, in order to allow the areas of all the pixel units on the array substrate to be the same, the body parts of the second signal lines satisfy the following requirements: the spacing between the body parts of two adjacent second signal lines are different (if the body parts are arcs, the spacing between two body parts refers to the difference between the curvature radii of the two arcs; if the body parts are circles, the spacing between the two body parts refers to the difference between the radii of the two circles). In FIG. 13, the differences between the radii of two adjacent circles 321 are different.

In order to allow the areas of the pixel units to be same, the spacing between the body parts of two adjacent second signal lines gradually decreases in the direction extending from the center of the shape formed by the outer edge of the above-mentioned display area to the outer edge. In particular, in FIG. 15, in the direction extending from the center of the rectangle formed by the outer edge of the above-mentioned display area to the outer edge, the spacing between the sides of two adjacent body parts 321 satisfy the following condition: D1>D2>D3.

Optionally, in a particular embodiment, the shape formed by the outer edge of the display area of the array substrate is a circular shape, and each of the above-mentioned second signal line has a shape of a circle or arc matching the above-mentioned circular shape. In the direction extending from the center of the circle to the outer edge, the radii of the circles or the curvature radii of the arcs successively distributed satisfy the following condition: $\sqrt{1}:\sqrt{2}:\sqrt{3}:2\ldots\sqrt{n}$, where n is the number of the second signal lines, so that the areas of all the pixel units on the array substrate are the same, thereby improving the display effect and displaying images in a better way.

In another embodiment of the present disclosure, the shape formed by the outer edge of the display area of the array substrate is rectangular, and the above-mentioned plurality of first signal lines are straight lines radially distributed with the central area of the rectangle used as the radiation center.

The connection relationship between the first and second signal lines and the thin film transistors and pixel electrodes on the array substrate will be described hereinafter by way of examples.

Figure 18:
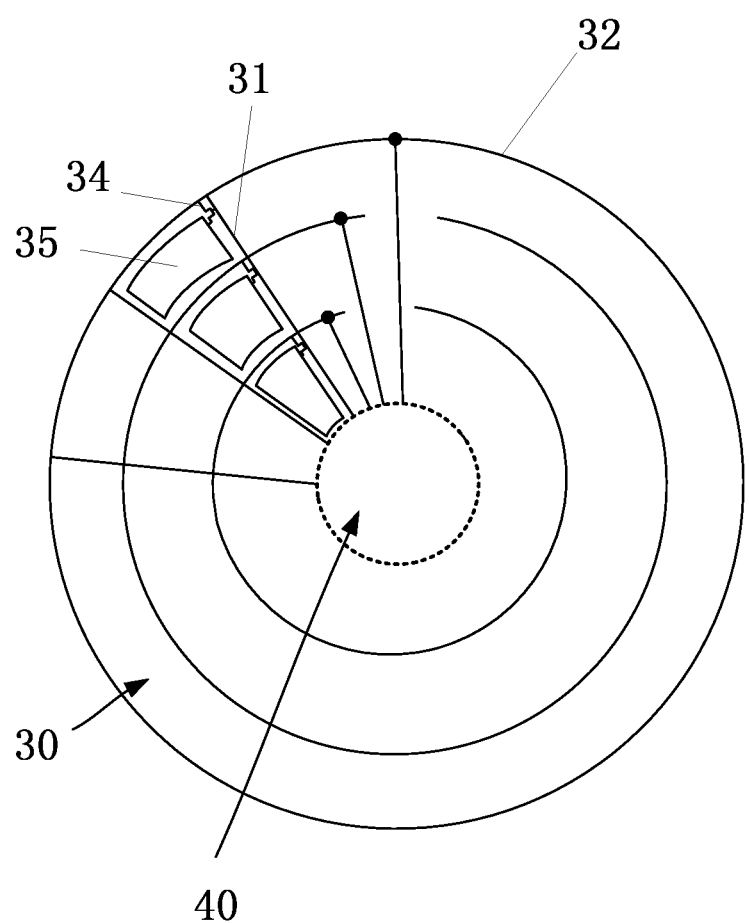
FIG. 18 is a schematic diagram of an array substrate according to at least one embodiment of the present disclosure.

Reference to FIG. 18, a schematic diagram of an array substrate provided by a seventeenth embodiment of the present disclosure is shown. In the embodiment as shown in FIG. 18, the above-mentioned display area 30 is provided with a plurality of first signal lines 31, a plurality of second signal lines 32 and a plurality of pixel units defined by intersecting first signal lines 31 and second signal lines 32. Each of the pixel unit includes a thin film transistor 34 and a pixel electrode 35. In the present embodiment, the first signal lines may be data lines and the second signal lines may be gate lines. Each of the pixel units defined by intersecting first signal lines (data lines) 31 and second signal lines (gate lines) 32 includes a thin film transistor 34 and a pixel electrode 35. The thin film transistors 34 are located around the intersections of the first signal lines (data lines) 31 and second signal lines (gate lines) 32. The gate electrodes of the thin film transistors 34 are connected with the second signal lines (gate lines) 32, and the source electrodes of the thin film transistors 34 are connected with the first signal lines (data lines) 31, and the drain electrodes of the thin film transistors 34 are connected with the pixel electrodes 35.

In the above-mentioned embodiments, the shapes formed by the body parts of the plurality of second signal lines are successively distributed outwards and centered on the radiation center of the plurality of first signal lines substantially radially distributed. It could be known that the lengths of the second signal lines are different, and the signal delays in the second signal line having a larger length and the second signal line having a smaller length are certainly different. In order to reduce the delays in the second signal lines having large lengths, the trace or shape of the second signal lines may be particularly designed in the embodiments of the present disclosure. For example, the widths of the body parts of the plurality of second signal lines successively increase in the direction extending from the center of the outer edge of the above-mentioned display area to the outer edge. Optionally, the cross sections of the body parts of the plurality of second signal lines successively increase. Optionally, the resistivity of the material of the body parts of the plurality of second signal lines gradually decreases. Optionally, the second signal lines located at outer positions are designed to be relatively smooth, and the second signal lines located at inner positions are designed as folded structures (e.g. jagged), so that the lengths of the second signal lines located at inner positions are increased and the difference between the signal delays in the second signal lines located at inner positions and the second signal lines located at outer positions are reduced.

It should be noted that the plurality of second signal lines may be made of the same or different materials. In order to simplify the processes, the plurality of second signal lines are made of the same material. Meanwhile, in order to reduce the delays in the second signal lines, the plurality of second signal lines may be made of different materials.

The present disclosure further provides a display device, which includes the array substrate of any of the above-mentioned embodiments.

Optionally, the above-mentioned display device further includes a non-display area and a drive circuit. The non-display area is provided with a drive circuit used to be connected with the above-mentioned first signal lines. Optionally, the above-mentioned drive circuit is located in a region of the non-display area which is surrounded by the display area, and the radiation center of the plurality of first signal lines are located in the region of the non-display area which is surrounded by the display area.

The above-mentioned drive circuit includes a first signal line drive circuit and/or second signal line drive circuit. Optionally, the first signal line drive circuit and second signal line drive circuit are arranged in the above-mentioned non-display area surrounded by the display area so that the area of the non-display area at the periphery of the display area is reduced and the bezel size of the display device is further reduced.

Each of the second signal lines further includes a lead part through which the body part of the above-mentioned second signal line is connected with the above-mentioned second signal line drive circuit.

Optionally, at least one drive circuit used to be connected with the above-mentioned second signal lines is also arranged in the above-mentioned non-display area, and such design allows a bezel-free design of the display device to be achieved.

The above-mentioned embodiments are merely optional embodiments of the present disclosure. It should be noted that improvements and modifications may be made by those skilled in the art without departing from the technical principles of the present disclosure. These improvements and modifications should also be considered within the scope of protection of the present disclosure.

What is claimed is:

1. An array substrate, comprising a base substrate, the base substrate comprising a display area, the display area provided with a plurality of first signal lines and a plurality of second signal lines, the plurality of first signal lines and the plurality of second signal lines intersecting to define a plurality of pixel units, and the plurality of first signal lines being substantially radially distributed, wherein each of the plurality of second signal lines comprises a body part, a shape of the body part matches a shape formed by an outer edge of the display area, and the body parts of the plurality of second signal lines are successively distributed outwards by taking a radiation center of the plurality of first signal lines radially distributed as a center.

2. The array substrate according to claim 1, wherein
the plurality of first signal lines comprises any of a straight line type, a broken line type or a curve type; or
the plurality of first signal lines comprises any combination of the straight line type, the broken line type and the curve type.

3. The array substrate according to claim 1, wherein the shape formed by the outer edge of the display area is a regular shape, the radiation center is a center of the regular shape, and the shapes formed by the body parts of the plurality of second signal lines are similar shapes being concentric and having different areas.

4. The array substrate according to claim 3, wherein
the regular shape is a circle,
the body part of each of the plurality of second signal lines is a circle or arc,
the body parts of the plurality of second signal lines are concentric circles having different radii or concentric arcs having different curvature radii, and
the radiation center is the center of the circle.

5. The array substrate according to claim 4, wherein
differences between the radii of every two adjacent concentric circles or differences between the curvature radii of every two adjacent concentric arcs are different.

6. The array substrate according to claim 5, wherein
the differences between the radii or the differences between the curvature radii gradually decrease in a direction extending from the center of the circle to the outer edge of the display area.

7. The array substrate according to claim 4, wherein
proportions of the radii or curvature radii of the body parts of the plurality of second signal lines successively distributed in a direction extending from the center of the circle to the outer edge satisfy a following condition:

$\sqrt{1}:\sqrt{2}:\sqrt{3}:2 \ldots \sqrt{n}$, where n is a number of the plurality of second signal lines.

8. The array substrate according to claim 1, wherein the plurality of pixel units have a substantially identical area.

9. The array substrate according to claim 1, wherein the pixel units are triangular, rectangular, trapezoidal or sector-ringed.

10. The array substrate according to claim 1, wherein
a distribution density of the body parts of the plurality of second signal lines gradually decreases in a direction extending from a center of the shape formed by the outer edge to the outer edge.

11. The array substrate according to claim 1, wherein widths of the body parts of the plurality of second signal lines gradually increase in a direction extending from a center of the shape formed by the outer edge to the outer edge.

12. The array substrate according to claim 1, wherein one of the first signal line and the second signal line is a gate line, and a remaining one of the first signal line and the second signal line is a data line.

13. A display device, comprising the array substrate according to claim 1.

14. The display device according to claim 13, wherein the plurality of second signal lines is made of an identical material or different materials.

15. The display device according to claim 13, further comprising:
- a non-display area; and
- a drive circuit,
- the drive circuit is arranged in the non-display area and in a region of the non-display area surrounded by the display area, a radiation center of the plurality of first signal lines is located in the region of the non-display area surrounded by the display area.

16. The display device according to claim 15, wherein the drive circuit comprises a first signal line drive circuit and/or a second signal line drive circuit.

17. The display device according to claim 16, wherein each of the plurality of second signal lines further comprises a lead part, and a body part of each of the plurality of second signal lines is connected with the second signal line drive circuit through the lead part corresponding to the body part.

18. The display device according to claim 17, wherein the body part and the lead part of each of the plurality of second signal lines are made of an identical material and at a same layer through one patterning process.

19. The display device according to claim 17, wherein the body part and the lead part of each of the plurality of second signal lines are arranged at different layers and connected through a via hole.

20. A display device comprising:
- an array substrate, comprising a base substrate, the base substrate comprising a display area, the display area provided with a plurality of first signal lines and a plurality of second signal lines, the plurality of first signal lines and the plurality of second signal lines intersecting to define a plurality of pixel units, and the plurality of first signal lines being substantially radially distributed:
- a non-display area; and
- a drive circuit,
- the drive circuit is arranged in the non-display area and in a region of the non-display area surrounded by the display area, a radiation center of the plurality of first signal lines is located in the region of the non-display area surrounded by the display area.

* * * * *